United States Patent
Inui et al.

(10) Patent No.: US 10,103,183 B2
(45) Date of Patent: Oct. 16, 2018

(54) MANUFACTURING METHOD OF IMAGING DEVICE AND IMAGING SYSTEM

(71) Applicant: CANON KABUSHIKI KAISHA, Tokyo (JP)

(72) Inventors: Fumihiro Inui, Yokohama (JP); Hiroaki Sano, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/848,652

(22) Filed: Dec. 20, 2017

(65) Prior Publication Data

US 2018/0182793 A1    Jun. 28, 2018

(30) Foreign Application Priority Data

Dec. 27, 2016    (JP) ................................. 2016-254363

(51) Int. Cl.
*H01L 31/14*  (2006.01)
*H01L 27/146*  (2006.01)
*H01L 21/225*  (2006.01)

(52) U.S. Cl.
CPC .... *H01L 27/14605* (2013.01); *H01L 21/2253* (2013.01); *H01L 27/1463* (2013.01); *H01L 27/14643* (2013.01)

(58) Field of Classification Search
CPC ......... H01L 27/14643; H01L 27/14689; H01L 21/2652; H01L 21/266; H01L 27/1463
See application file for complete search history.

(56) References Cited

U.S. PATENT DOCUMENTS 8,476,153 B2 *  7/2013  Tezuka .............. H01L 27/14643
                                                         438/517
2010/0321518 A1 * 12/2010  Shinohara ......... H01L 27/14621
                                                         348/222.1

FOREIGN PATENT DOCUMENTS

JP    2011003716 A    1/2011

* cited by examiner

*Primary Examiner* — Jaehwan Oh
(74) *Attorney, Agent, or Firm* — Canon U.S.A., Inc. IP Division

(57) ABSTRACT

A manufacturing method of an imaging device includes ion-implanting impurity ions of a second conductivity type into a first region and a second region using a first mask, the first region being disposed under a region to be an electric charge accumulation region and the second region being under an element isolation portion, continuous with the first region, and positioned shallower than the first region, and ion-implanting impurity ions of the second conductivity type into a third region and a fourth region using a second mask, the third region being disposed under the region and positioned shallower than the first region, and the fourth region being under the element isolation portion, continuous with the third region and the second region, and positioned shallower than the third region and the second region, wherein the first and the second mask cover a part of the element isolation portion and have an aperture.

20 Claims, 14 Drawing Sheets

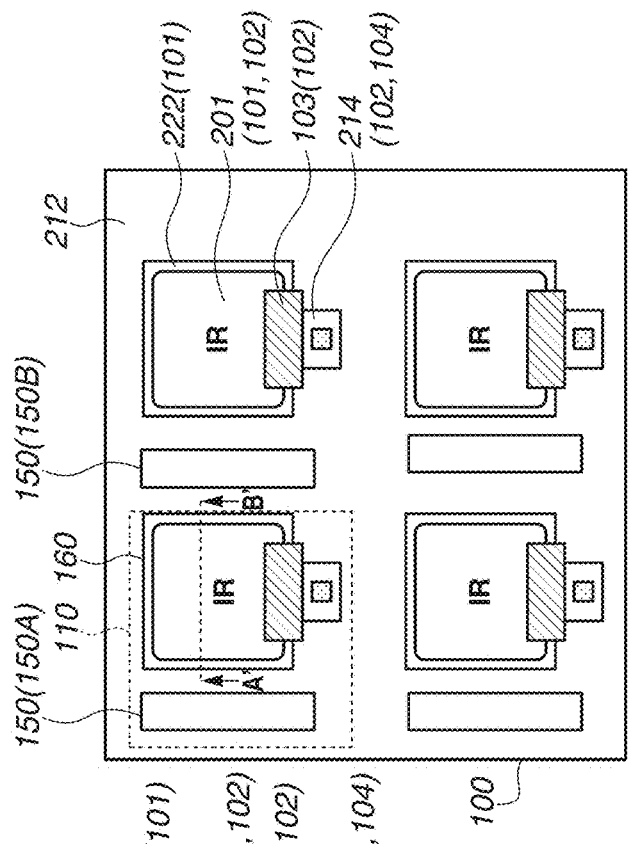

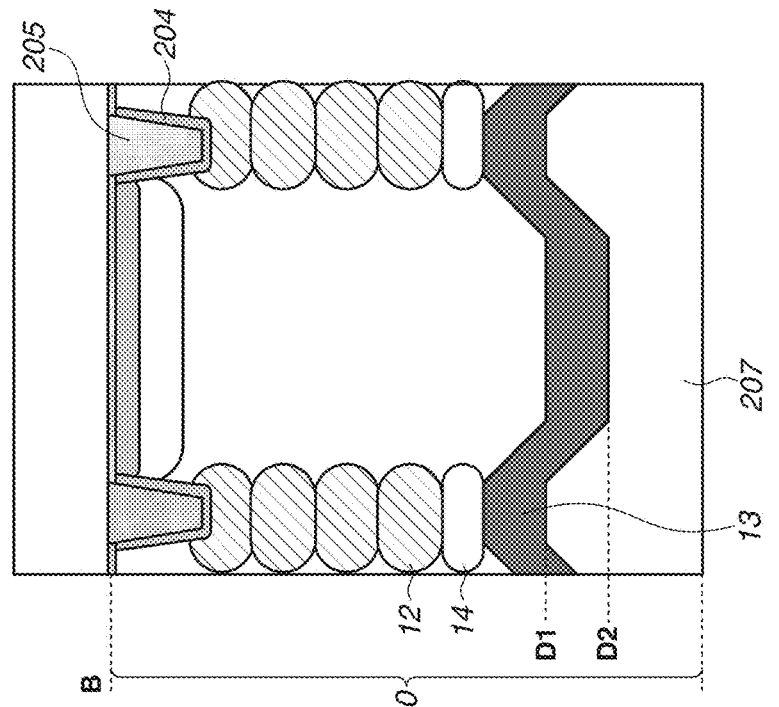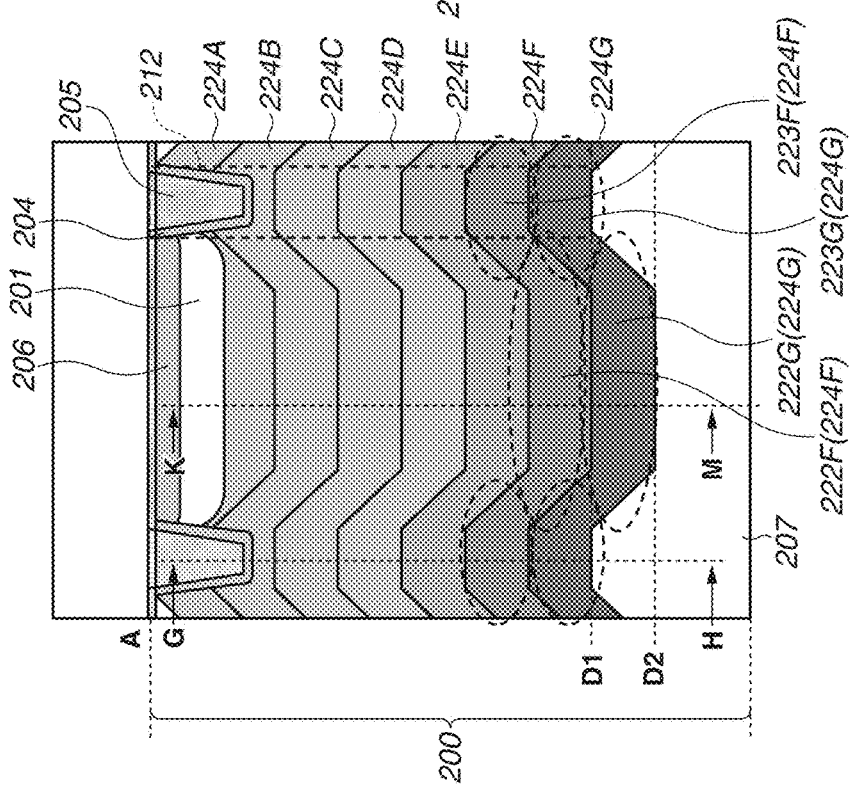

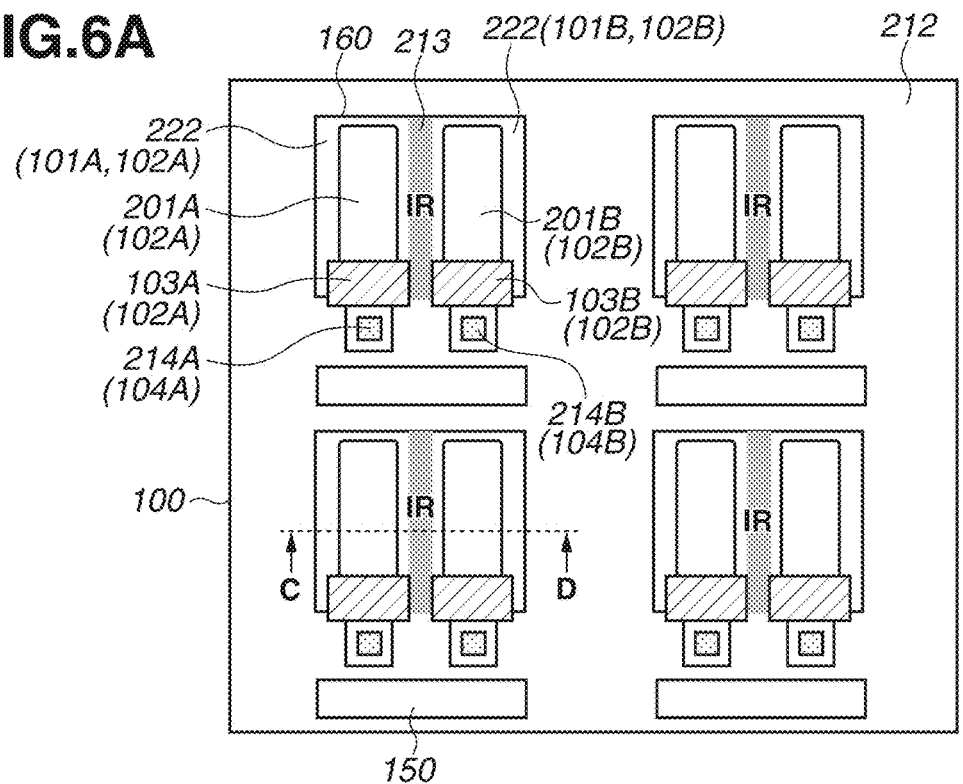
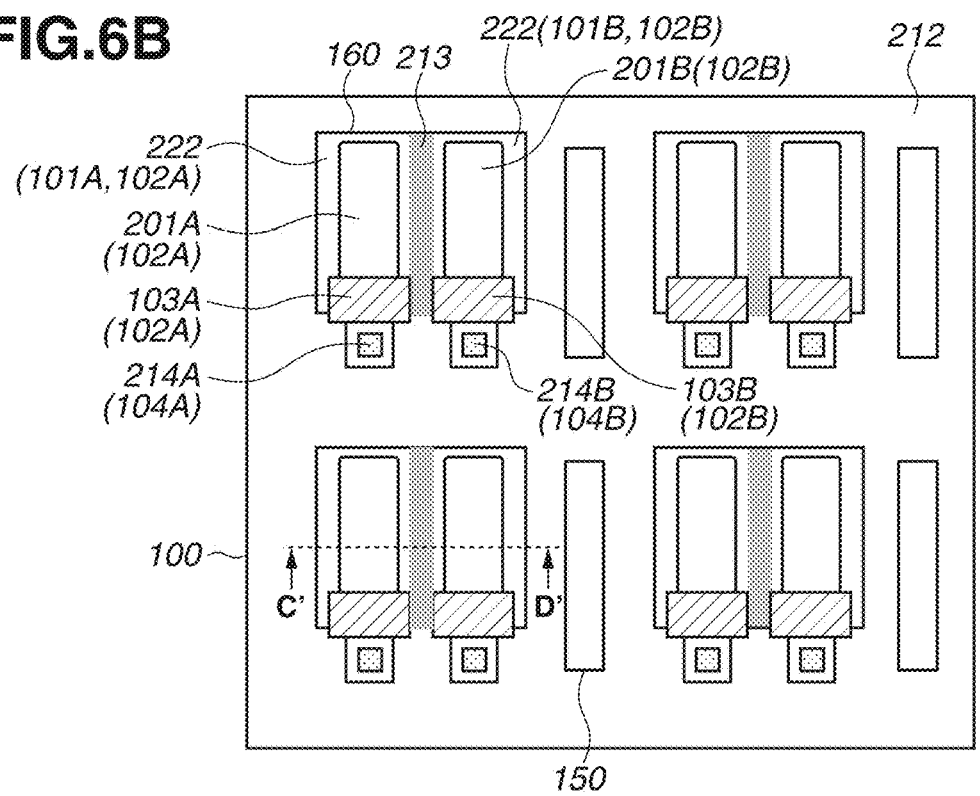

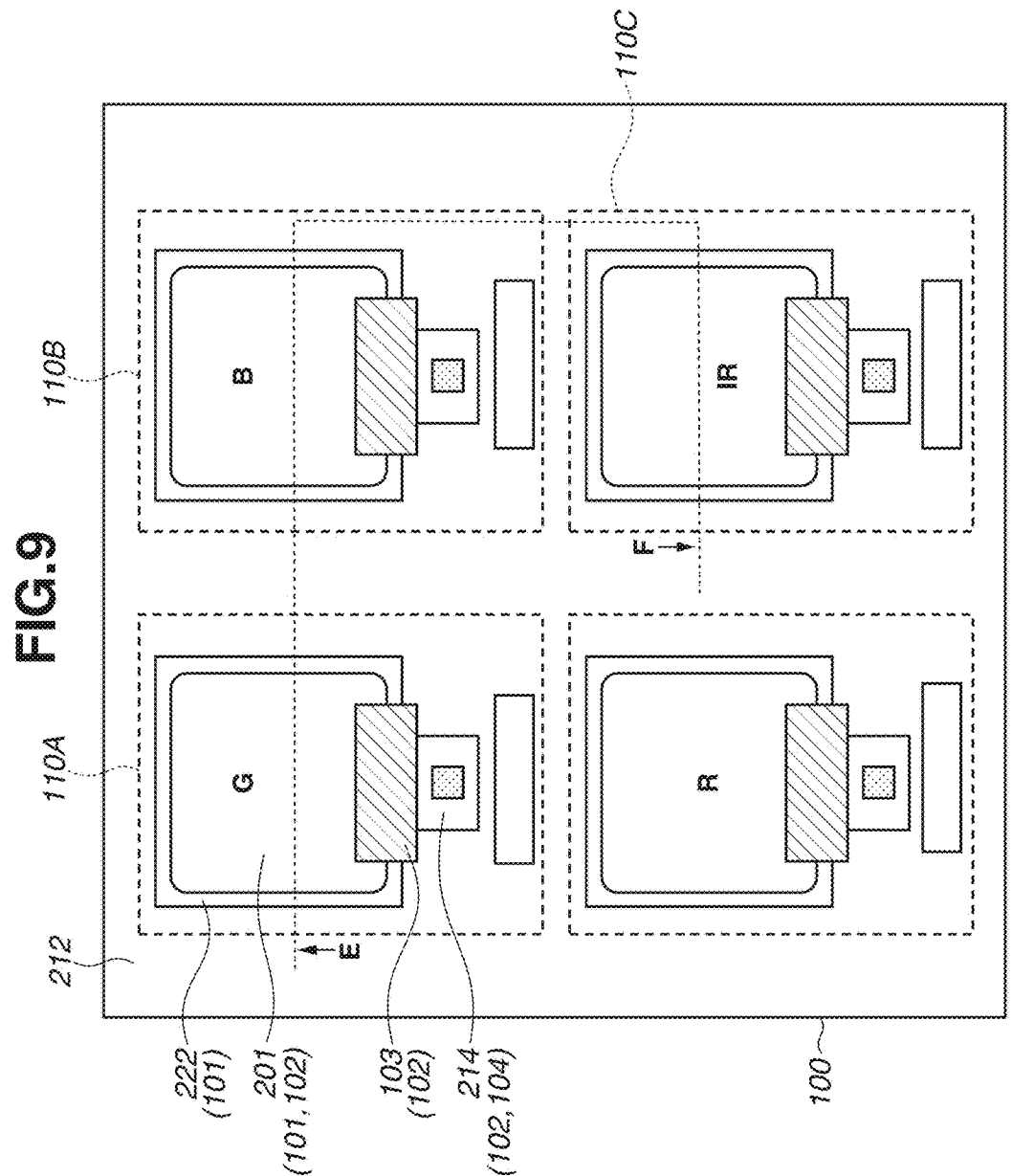

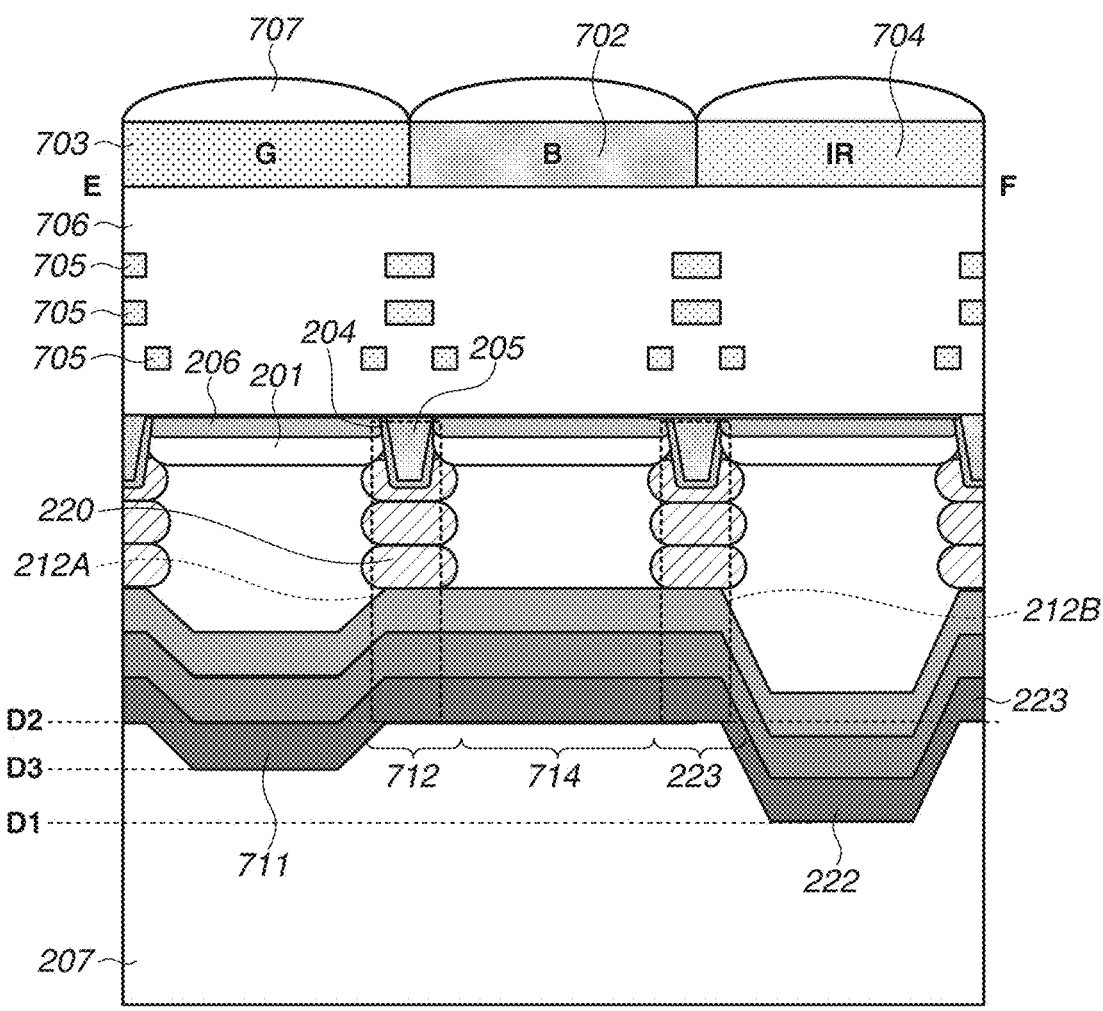

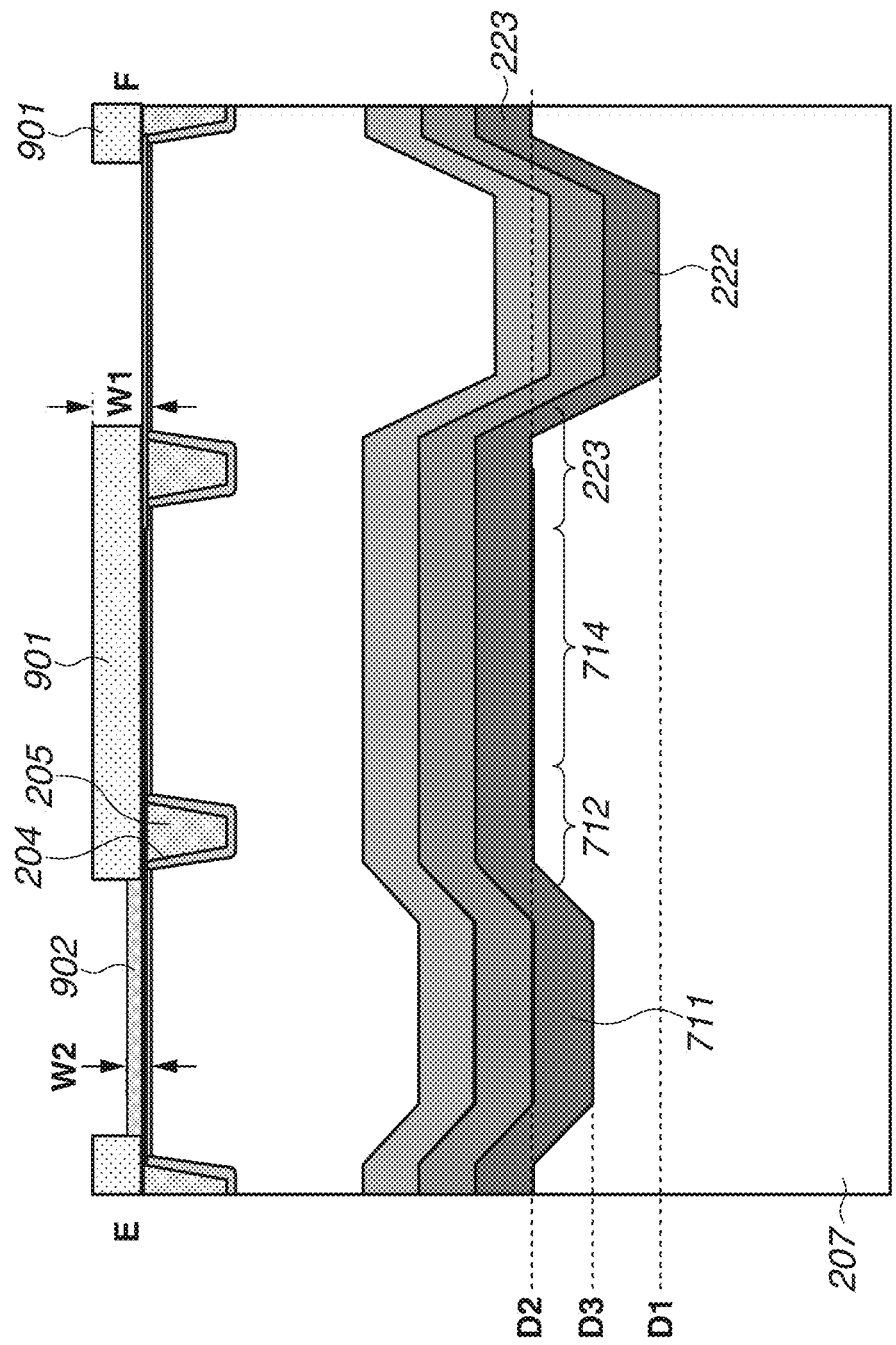

MANUFACTURING METHOD OF IMAGING DEVICE AND IMAGING SYSTEM

BACKGROUND

Field of the Disclosure

The present disclosure relates to a manufacturing method of an imaging device.

Description of the Related Art

A two-dimensional charge coupled device (CCD) type imaging device or an amplifying type metal oxide semiconductor (MOS) imaging device is used in a digital still camera and a camcorder.

Japanese Patent Application Laid-Open No. 2011-3716 discusses a structure in which a photoelectric conversion portion and an element isolation region for electrically isolating the photoelectric conversion portion from other elements are disposed in an N-type semiconductor substrate. In a deep part of an N-type semiconductor substrate, a P-type semiconductor region is disposed. The P-type semiconductor region has a portion disposed at a first depth under a region where the photoelectric conversion portion is formed and a portion disposed at a second depth that is shallower than the first depth under the element isolation region. The P-type semiconductor region disposed at the first depth and the P-type semiconductor region disposed at the second depth are continuous.

In addition, another P-type semiconductor region is formed on the P-type semiconductor region disposed at the second depth. On the other hand, on the P-type semiconductor region disposed at the first depth, an N-type semiconductor region is formed so as to form an interface with the P-type semiconductor region disposed at the first depth. With this structure discussed in Japanese Patent Application Laid-Open No. 2011-3716, mixing of electric charges generated at a deep position of a semiconductor substrate of a pixel into a photoelectric conversion portion of adjacent pixels is suppressed in a case where pixels are miniaturized. It is also possible to suppress mixing of electric charges into a pixel transistor of adjacent pixel o the same pixel in addition to the mixing of electric charges into a photoelectric conversion portion of an adjacent pixel.

Japanese Patent Application Laid-Open No. 2011-3716 also discusses a manufacturing method of the above-described structure. Specifically, as illustrated in FIG. 2 of Japanese Patent Application Laid-Open No. 2011-3716, a first mask made of a resist is formed on an element isolation region, and ion implantation for forming a P-type semiconductor region is performed. A P-type semiconductor region disposed at a first depth is formed under a region where the first mask is not formed, and under a region where the first mask is formed, a P-type semiconductor region disposed at a second depth is formed.

Next, a second mask made of a resist is formed on a region other than the element isolation region, and ion implantation for forming a P-type semiconductor region is performed. The P-type semiconductor region formed using the second mask is an impurity region formed on the P-type semiconductor region disposed at the second depth. Here, the first mask is required to have a thickness to allow permeation of impurities, whereas the second mask is required to have a thickness not to allow permeation of impurities. In other words, the second mask should be thicker than the first mask.

SUMMARY

According to an aspect of the present disclosure, a manufacturing method of an imaging device including, in a semiconductor substrate, a plurality of pixels each including a first active region in which an electric charge accumulation region of a first conductivity type configured to accumulate signal electric charges is disposed, and an element isolation portion that isolates the first active region from a second active region adjacent to the first active region, includes ion-implanting impurity ions of a second conductivity type different from the first conductivity type into a first region and a second region using a first mask, the first region being disposed under a region to be the electric charge accumulation region and the second region being under the element isolation portion, continuous with the first region, and positioned shallower than the first region, and ion-implanting impurity ions of the second conductivity type into a third region and a fourth region using a second mask, the third region being disposed under the region to be the electric charge accumulation region and positioned shallower than the first region, and the fourth region being under the element isolation portion, continuous with the third region and the second region, and positioned shallower than the third region and the second region, wherein the first mask covers an upper part of the element isolation portion and has an aperture corresponding to at least a part of the region to be the electric charge accumulation region, and wherein the second mask covers the upper part of the element isolation portion and has an aperture corresponding to at least a part of the region to be the electric charge accumulation region.

Further features of the present disclosure will become apparent from the following description of exemplary embodiments with reference to the attached drawings.

BRIEF DESCRIPTION OF THE DRAWINGS

FIGS. 1A and 1B are schematic plan views of an imaging device, according to one or more embodiment(s) of the present disclosure.

FIGS. 2A and 2B are schematic sectional views of the imaging device, according to one or more embodiments) of the present disclosure.

FIGS. 6A and 6B are schematic plan views of an imaging device, according to one or more embodiment(s) of the present disclosure.

FIG. 9 is a schematic plan view of an imaging device, according to one or more embodiment(s) of the present disclosure.

FIG. 10 is a schematic sectional view of the imaging device, according to one or more embodiment(s) of the present disclosure.

FIG. 11 is a diagram illustrating a manufacturing method of the imaging device, according to one or more embodiment(s) of the present disclosure.

DESCRIPTION OF THE EMBODIMENTS

Figure 3A:
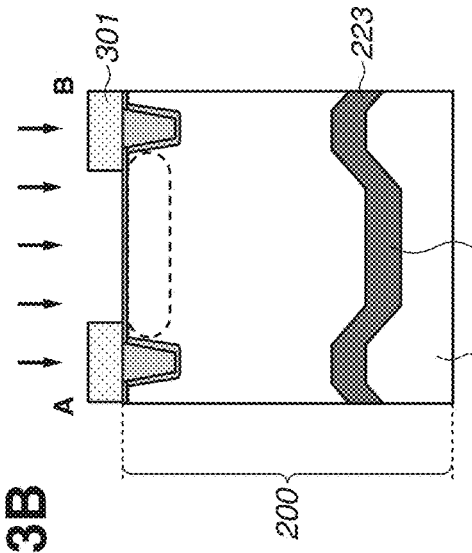
FIGS. 3A, 3B, 3C, and 3D are diagrams illustrating a manufacturing method of the imaging device, according to one or more embodiment(s) of the present disclosure.

Japanese Patent Application Laid-Open No. 2011-3716 discusses a pixel structure of RGB pixels, but does not discuss a pixel structure for providing sensitivity to light on the long wavelength side such as infrared light. In order to provide sensitivity to light on the long wavelength side, such as infrared light, it is necessary to form a pixel structure for obtaining electric charges generated in a deeper portion of a semiconductor substrate as compared to the pixel structure of the RGB pixels.

However, in order to provide sensitivity to long wavelength light such as infrared light, the P-type semiconductor region formed on the P-type semiconductor region disposed at the second depth needs to be disposed at a deeper position, which requires higher ion implantation energy. Accordingly, the thickness of the above-described second mask needs to be made larger, and thus the aspect ratio, which is a ratio of the thickness of the second mask to an aperture width of the second mask, is increased.

Since it is difficult to form such a mask pattern having a high aspect ratio, the P-type semiconductor region to be formed on the P-type semiconductor region disposed at the second depth may be formed closer to the front surface of the semiconductor substrate than a desired depth. In this case, the P-type semiconductor region disposed at the second depth may not be connected to the P-type semiconductor region formed on the P-type semiconductor region disposed at the second depth. Accordingly, electric charges generated at a deep position of a semiconductor substrate when light on the long wavelength side, such as infrared light, is incident thereon may be mixed into a photoelectric conversion portion and the like of an adjacent pixel. The present disclosure is directed to a manufacturing method of an imaging device that suppresses mixing of electric charges generated at a deep position of a semiconductor substrate into a photoelectric conversion portion and the like of an adjacent pixel when light on the long wavelength side, such as infrared light, is incident on the imaging device.

An imaging device according to a first exemplary embodiment applicable to the present disclosure will be described with reference to FIGS. 1A to 3D and FIGS. 12A and 12B. FIGS. 1A and 1B are schematic plan views of the imaging device. FIG. 2A is a schematic sectional view of the imaging device taken along a line segment AB in FIG. 1A. FIGS. 3A to 3D are diagrams illustrating a manufacturing method of the imaging device.

The present exemplary embodiment will be described assuming that a first conductivity type is P-type and a second conductivity type is N-type. In addition, in the present exemplary embodiment, electrons generated in a photoelectric conversion portion are referred to as signal electric charges (hereinafter also referred to as electric charges), and a part that functions as a barrier against the electrons are referred to as a potential barrier. In the present exemplary embodiment, the same reference numerals are given to components having the same function the drawings, and in a case where there is a plurality of the same components, subscripts A and B are used if it is necessary to identify each of the components, but if there is no need to identify each of them, the components are described without such subscripts.

First, a structure of an imaging device will be described with reference to FIGS. 1A and 1B. The imaging device according to the present exemplary embodiment has a plurality of pixels 110. Each pixel has an infrared light filter. Here, as an example, four pixels 110 of two rows and two columns are arranged in a pixel region 100. Although not illustrated, a peripheral circuit region may be arranged around the pixel region 100. Here, the peripheral circuit region is a region where a circuit for generating a control signal to read signal electric charges from a photoelectric conversion portion and a circuit for performing signal processing on electric charges are disposed. For example, circuits disposed in the peripheral circuit region may include a scanning circuit, a timing generator, an amplifier, an analog-to-digital (A/D) converter, and the like.

Each of the pixels 110 of FIGS. 1A and 1B has an active region 160 and an active region 150. In the active region 160 the pixel 110, a photoelectric conversion portion 101, a transfer transistor 102, and a floating diffusion region 104 are disposed.

In the active region 160, the photoelectric conversion portion 101 is formed by PN junction of an N-type semiconductor region 201 and a P-type semiconductor region 222. The N-type semiconductor region 201 forms an electric charge accumulation region that accumulates electric charges generated in the photoelectric conversion portion 101. The floating diffusion region 104 includes an N-type semiconductor region 214 (214A, 214B), and is a region to which electric charges accumulated in the photoelectric conversion portion 101 are transferred. The transfer transistor 102 includes the N-type semiconductor region 201, a gate electrode 103, and the N-type semiconductor region 214, and transfers electric charges accumulated in the photoelectric conversion portion 101 to the floating diffusion region 104.

In the active region 150, an amplifying portion (amplifying transistor) for outputting a signal based on signal electric charges accumulated in the electric charge accumulation region and a pixel transistor such as a reset portion (reset transistor) for resetting the potential of the input node of the amplifying portion are disposed. In FIGS. 1A and 1B, the specific structure of the pixel transistor is not provided.

FIG. 1A is a schematic plan view illustrating a structure in which an active region 160A (first active region) of a pixel 110 and an active region 160B (second active region) of an adjacent pixel are adjacent to each other with an isolation region 212 therebetween. On the other hand, FIG. 1B illustrates a structure in which an active region 160 (first active region) of the pixel 110 and an active region 150B (second active region) of an adjacent pixel 110 are adjacent to each other with the isolation region 212 therebetween.

In FIGS. 1A and 1B, the isolation region 212 isolates adjacent active regions. Isolation herein means a structure for suppressing movement of signal electric charges and propagation of voltage fluctuation between adjacent active regions. Typically, the isolation region 212 is a region that isolates the active regions 160 each having an electric charge accumulation region.

In the following exemplary embodiments, the structure in the schematic plan view of FIG. 1A will be described, but the description is similar for the structure in the schematic plan view of FIG. 1B. The structure is not limited to the structures of FIGS. 1A and 1B.

FIG. 2A is a schematic sectional view along the line segment AB of FIG. 1A. In FIGS. 2A and 2B, in a semiconductor substrate 200, a surface on which an element isolation portion 205 is disposed is defined as a shallow part, and a surface opposite to the surface on which the element isolation portion 205 is defined as a deep part. In FIGS. 2A and 2B, a shallower part is defined as an upper part and the deeper part is defined as a lower part.

In FIG. 2A, the isolation region 212 includes the element isolation portion 205, a P-type semiconductor region 204, and a plurality of P-type semiconductor regions 223. The element isolation portion 205 is made of an insulator, and isolates the active region 160 of the pixel 110 from the active region 160B of the adjacent pixel in the structure of FIG. 1A. In the structure of FIG. 1B, the element isolation portion 205 isolates the active region 160 of the pixel 110 from the active region 150 or the active region 150B of the adjacent pixel 110.

The element isolation portion 205 is disposed on the front surface side of the semiconductor substrate 200. The element isolation portion 205 can have any structure such as a local oxidation of silicon (LOCOS) structure or a shallow trench isolation (STI) structure. Further, the element isolation portion 205 may have an isolation structure made of a P-type semiconductor region, that is, a structure of diffusion isolation structure.

Note that the front surface of the substrate is, for example, an interface between the semiconductor region and the insulator region disposed on the semiconductor region. When an insulator isolation structure of STI or LOCOS is used, the interface between the semiconductor region and the insulator region is not flat. In this case, for example, the interface between the semiconductor region and the insulator region in the channel of the transistor disposed on the substrate is the front surface of the substrate.

The N-type semiconductor region 201 is disposed the shallow part of the semiconductor substrate 200 between two element isolation portions 205. A P-type semiconductor region 206 is disposed as a front surface protection layer on the N-type semiconductor region 201.

The P-type semiconductor region 204 is a P-type channel stop region provided under the element isolation portion 205. The P-type semiconductor regions 223 are disposed under the element isolation portion 205, and the plurality of P-type semiconductor regions 223 serves as potential barriers between the adjacent active regions. In FIG. 2A, only a P-type semiconductor region 223G and a P-type semiconductor region 223F located in a deep part of the semiconductor substrate are denoted by reference numerals, the P-type semiconductor regions 223 are also disposed in a region located shallower than the P-type semiconductor region 223F.

The P-type semiconductor regions 222 are disposed under the N-type semiconductor region 201. The P-type semiconductor regions 222 serve as a potential barrier between the N-type semiconductor region 201 and an N-type semiconductor region 207 to be described below. In FIG. 2A, a P-type semiconductor region 222G and a P-type semiconductor region 222F located in a deep part of the semiconductor substrate are denoted by reference numerals, the P-type semiconductor regions 222 are also disposed in a region located shallower than the P-type semiconductor region 222F. The P-type semiconductor region 222 and the P-type semiconductor region 223 to which the same alphabet is added are continuous regions.

Note that "continuous" means that a predetermined semiconductor region and a predetermined semiconductor region are connected to each other, and no semiconductor region having a different conductivity type is formed between the predetermined semiconductor region and the predetermined semiconductor region. Specifically, for example, the P-type semiconductor regions 222 and the P-type semiconductor regions 223 are disposed as illustrated by dotted ellipses, and parts of the P-type semiconductor regions 222 and parts of the P-type semiconductor regions 223 are in contact with or overlapped with each other. In addition, the continuous regions may be connected by diffusion of impurity ions when the P-type semiconductor regions 222 and the P-type semiconductor regions 223 are formed.

Here, for simplicity of description, seven P-type semiconductor regions 224 are disposed from the shallow part to the deep part as an example. In FIG. 2A, reference numerals 224A to 224G respectively represent the seven P-type semiconductor regions 224 in order from the shallow part to the deep part. Here, one of the P-type semiconductor regions 222 and corresponding one of the P-type semiconductor regions 223, which are formed by the same ion implantation and are continuous, are referred to as a P-type semiconductor region 224 for convenience.

Description will be made with reference to FIG. 2A. The P-type semiconductor region 223G (second region) is disposed at a position shallower than the P-type semiconductor region 222G (first region). The P-type semiconductor region 223G and the P-type semiconductor region 222G are continuous.

The P-type semiconductor region 223F (fourth region) is disposed at a position shallower than the P-type semiconductor region 222F (third region) and the P-type semiconductor region 223G. In addition, the P-type semiconductor region 222F (third region) and the P-type semiconductor region 223F (fourth region) are continuous, and are referred to as a P-type semiconductor region 224F for convenience. The P-type semiconductor region 223F is continuous with the P-type semiconductor region 223G and serves as a potential barrier that isolates photoelectric conversion portions and the like of adjacent pixels.

The P-type semiconductor region 223G forms a PN junction interface with the N-type semiconductor region 207 at a depth D1, and the P-type semiconductor region 222G forms a PN junction interface with the N-type semiconductor region 207 at a depth D2, which is a position deeper than the depth D1. The difference between the depth D1 and the depth D2 is, for example, 1 µm or more and 2 µm or less. Since the P-type semiconductor region 222F and the P-type semiconductor region 222G are continuous, it is possible to suppress generation of a region with a potential lower than the electron between the P-type semiconductor region 222F and the P-type semiconductor region 222G.

The P-type semiconductor region 222 included in a P-type semiconductor region 224A forms a PN junction with the N-type semiconductor region 201. The N-type semiconductor region 201, the P-type semiconductor region 206, and the P-type semiconductor regions 222 form the photoelectric conversion portion 101.

The N-type semiconductor region 207 is disposed under the P-type semiconductor region 224G and at a deep part of the semiconductor substrate 200. The N-type semiconductor region 207 may be formed by disposing the plurality of P-type semiconductor regions 224 on the N-type semiconductor substrate 200, or by N-type ion implantation into the P-type semiconductor substrate 200.

A comparative exemplary embodiment will now be described with reference to FIG. 2B. In contrast to the conventional pixel structure, the comparative exemplary embodiment is obtained by forming a semiconductor region in a deeper part of a semiconductor substrate compared to RGB pixels to provide sensitivity to long wavelength light such as infrared light.

In the isolation region 212 of FIG. 2B, a P-type semiconductor region 13 corresponding to the P-type semiconductor region 223 of a P-type semiconductor region 224G of FIG. 2A and a P-type semiconductor region 12 included in the isolation region 212 may not be continuous.

This is because the P-type semiconductor region. 13 of a pixel for providing sensitivity to long wavelength light such as infrared light is disposed at a deep position of the semiconductor substrate in FIG. 2B as compared to the P-type semiconductor region 13 disposed in RGB pixels.

In order to form such a P-type semiconductor region 12, high ion implantation energy is required, and it is necessary to increase the film thickness of a mask (for example, a photoresist pattern) used for forming the P-type semiconductor region 12.

However, when the aspect ratio, which is the ratio of the thickness of the mask to the aperture width of the mask, is increased, it becomes difficult to form the mask. Therefore, when the P-type semiconductor region 12 is formed by a mask that can be formed, a region 14 having a low potential may be generated between the P-type semiconductor region 13 and the P-type semiconductor region 12. The region 14 having a low potential is, specifically, for example, the N-type semiconductor region 207.

Then, according to the structure of FIG. 2B, electric charges generated at the deep position of the semiconductor substrate in the pixel for providing the sensitivity to light on the long wavelength side, such as infrared light, may mix into the photoelectric conversion portion of an adjacent pixel.

On the other hand, according to the structure of the present exemplary embodiment, a plurality of pairs of continuous P-type semiconductor regions 223 and the P-type semiconductor regions 222 is arranged at various depths. Then, the adjacent P-type semiconductor regions 223 are continuous. Therefore, a potential barrier is generated down to a deep position of the semiconductor substrate under the element isolation portion.

Therefore, it is possible to suppress mixing of electric charges generated at the deep position of the semiconductor substrate in the pixel for providing the sensitivity to light on the long wavelength side, such as infrared light, into the photoelectric conversion portion and the like of an adjacent pixel.

In the structure according to the present exemplary embodiment, the P-type semiconductor region 224 is not formed in the peripheral circuit region (not illustrated) As a result, the P-type semiconductor region 224 is not formed continuously from the pixel region 100 to the peripheral circuit region. Thus, the pixel region 100 and the peripheral circuit region are electrically isolated. In the peripheral circuit region, a P-type well region may be provided as long as the pixel region 100 and the peripheral circuit region are electrically isolated. According to such a structure, the N-type semiconductor region 207 is not divided by the P-type semiconductor region 224. Thus, voltage can be supplied from the N-type semiconductor region 207 to the peripheral circuit region also, so that operation of the peripheral circuit region can be stabilized.

Figure 12A:
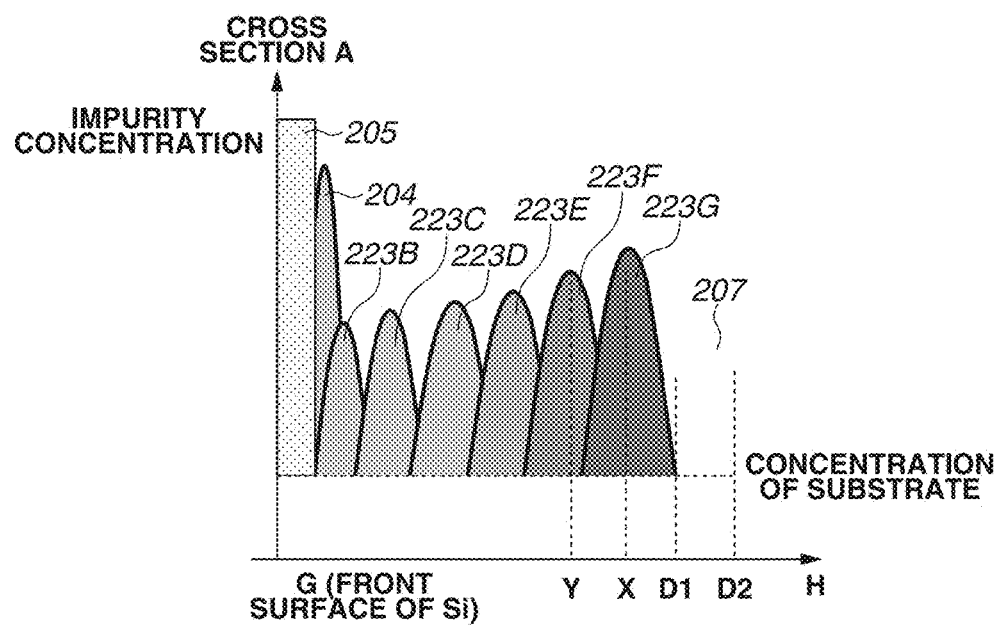
FIGS. 12A and 12B are diagrams illustrating impurity concentration, according to one or more embodiment(s) of the present disclosure.

Next, with reference to FIGS. 12A and 12B, impurity concentrations along a line segment GH and a line segment KM of FIG. 2A according to the present exemplary embodiment will be described. A graph illustrated in FIG. 12A is an impurity concentration distribution along the line segment GH. A graph illustrated in FIG. 12B is an impurity concentration distribution along the line segment KM.

In FIG. 12A, the isolation region 212 illustrated in FIG. 1 includes the element isolation portion 205, the P-type semiconductor regions 204, and the P-type semiconductor regions 223.

Figure 12B:
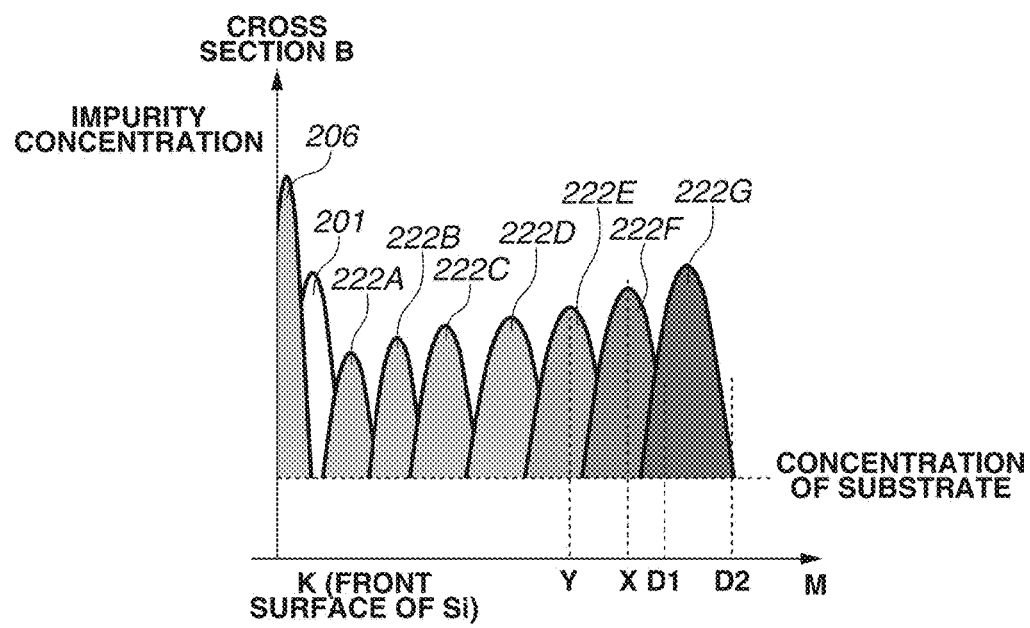

In FIG. 12B, the photoelectric conversion portion includes the P-type semiconductor region 206, the N-type semiconductor region 201, and the P-type semiconductor regions 222.

In FIG. 12A, P-type semiconductor regions 223A to 223G are disposed continuously. Similarly, in FIG. 12B, the P-type semiconductor regions 222A to 222G are disposed continuously. The P-type semiconductor region 223G and the P-type semiconductor region 222E are formed continuously, and the difference in depth is 1 μm or more and 2 μm or less. This also applies to the P-type semiconductor regions 222B to 222F and the P-type semiconductor regions 223B to 223F.

Therefore, the peaks of the impurity concentration at a position Y in FIG. 12A and the impurity concentration at position X deeper than the position Y in FIG. 12B are equivalent. Comparing the impurity concentration at the position Y in FIG. 12A to the impurity concentration at the position Y in FIG. 12B, the impurity concentration of the P-type semiconductor region 223 in FIG. 12A is higher. This is caused by difference of the depths at which the P-type semiconductor regions 224 (the P-type semiconductor regions 222 and the P-type semiconductor regions 223) are disposed between the portion under the element isolation portion 205 and the portion under the N-type semiconductor region 201.

By providing a plurality of such P-type semiconductor regions 224, the impurity concentration of the graph 334 is higher than that of the graph 333 when compared at the same depth, and the impurity concentration can be lowered from the deep part toward the shallow part in each graph.

Such a gradient of the impurity concentration causes a gradient of the potential in the depth direction due to the difference in concentration. Therefore, it is possible to make the potential of the region under the element isolation portion 205 higher than the portion under the N-type semiconductor region 201 at the same depth, and to make the potential under the N-type semiconductor region 201 lower along the depth direction from the deep part toward the shallow part. Therefore, the potential structure that allows signal electric charges generated under the N-type semiconductor region 201 to easily move from the deep part to the sallow part is obtained.

The gradient of the potential is not limited as long as the gradient changes monotonously toward the N-type semiconductor region 201 that accumulates signal electric charges, and may change in stepped configuration or intermittently.

In other words, in the present exemplary embodiment, the sensitivity of the photoelectric conversion portion can be improved by making the gradient of the impurity concentration that allows electric charges generated in the P-type semiconductor regions 222 under the N-type semiconductor region 201 to easily move from the deep part to the shallow part.

Next, referring to FIGS. 3A to 3D, the manufacturing method of the imaging device according to the present exemplary embodiment will be described. In FIGS. 3A to 3D, an example using a photoresist pattern as a mask will be described. The photoresist pattern can be formed by using a general photolithography technique, so the description thereof is not provided. Although a structure using a photoresist pattern as a mask is illustrated, other structures can be possible in a case where the ion stopping power of the photoresist pattern and the semiconductor substrate in ion implantation is equivalent. For example, a mask can be formed by patterning polysilicon, an oxide film, or the like.

First, the process in FIG. 3A will be described. As illustrated in FIG. 3A, the semiconductor substrate 200 is an N-type semiconductor substrate and has the N-type semiconductor region 207. In the N-type semiconductor region 207, the P-type semiconductor region 204 to serve as a channel stop region is formed, then the element isolation portion 205 is formed. The N-type semiconductor region 207 may be a region formed by performing N-type ion implantation into a P-type semiconductor substrate.

Figure 3B:
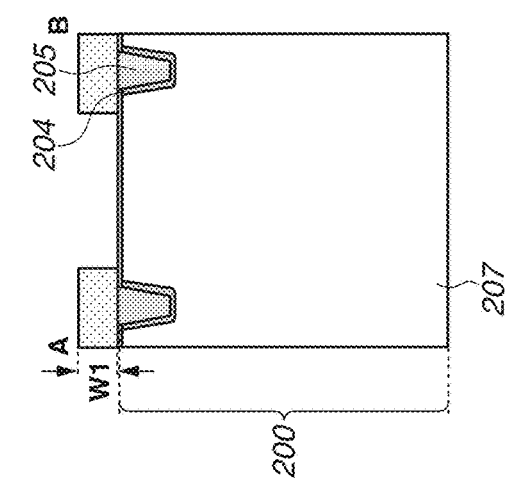

Then, a mask 301 having an aperture in at least a part of the region to be the N-type semiconductor region 201 indicated by the dotted line in FIG. 3B and covers the upper part of the element isolation portion 205 is formed on the semiconductor substrate 200. The mask 301 has a thickness W1.

FIG. 3A illustrates a structure where the mask 301 does not cover the front surface of the semiconductor substrate 200 at the aperture portion. However, the mask 301 may also be disposed on the aperture portion. In this case, the distance from the bottom surface of the aperture of the mask 301 to the front surface of the semiconductor substrate 200 is smaller than the distance from the upper part of the mask 301 to the upper part of the semiconductor substrate 200.

Figure 3C:
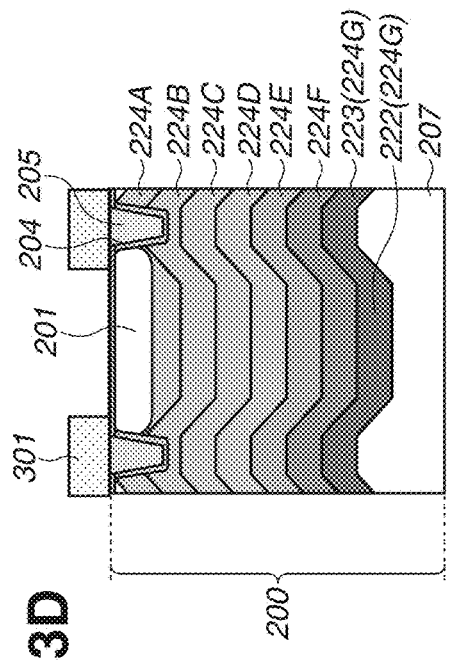
Figure 3D:
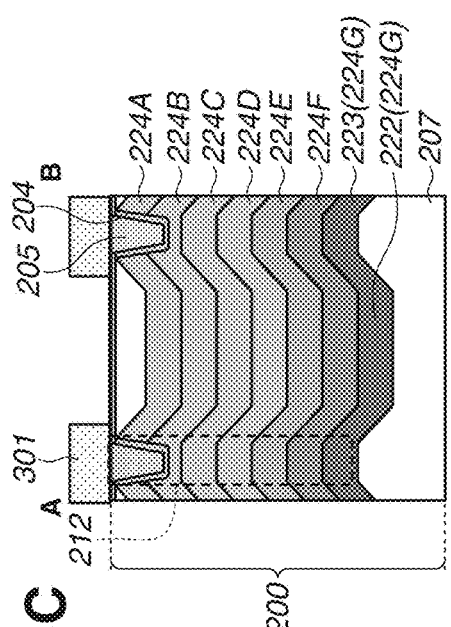

In the case where the element isolation portion 205 is formed as a diffusion isolation portion, the diffusion isolation portion may be formed in a step between. FIG. 3C and FIG. 3D described below. In that case, the mask 301 covering the upper part f the region to be the element isolation portion 205 is formed.

Next, the process in FIG. 3B will be described. As indicated by the arrows in FIG. 3B, using the mask 301, P-type impurity ions such as boron (B) are implanted with first ion implantation energy into the portion under the region to be the N-type semiconductor region 201 and the portion under the element isolation portion 205.

Specifically, the first ion implantation energy is ion implantation energy of approximately 3.0 MeV or more and 10 MeV or less. The P-type impurity ion concentration to be implanted here is, for example, approximately $0.2 \times 10^{13}$ atoms/cm$^3$ or more and $5.0 \times 10^{13}$ atoms/cm$^3$ or less.

By this ion implantation, the P-type semiconductor region 224G is formed. At this time, the P-type semiconductor region 223 included in the P-type semiconductor region 224G is formed such that the impurity concentration peak is at a depth of 3 to 4 µm. Then, the P-type semiconductor region 222 included in the P-type semiconductor region 224G is formed such that the impurity concentration peak is at a depth of 4 to 5 µm. At this time, the thickness W1 of the mask 301 is 1 to 2 µm, for example. The mask thickness W1 is not limited to this.

At this time, the peripheral circuit region is covered with a mask. The thickness of a mask covering the peripheral circuit region can be larger than the thickness W1. Specifically, the thickness of the mask covering the peripheral circuit region can be set to such a thickness that impurity ions do not penetrate (permeate) during ion implantation, so that a structure without the P-type semiconductor region 204 provided in the peripheral circuit region is possible. According to this structure, voltage can be supplied from the N-type semiconductor region 207 to the peripheral circuit region. The mask 301 covering the pixel region and a mask covering the peripheral region may be masks formed by the same patterning process or masks formed by a plurality of patterning processes. More specifically, such masks having different thicknesses can be formed by a method in which the sensitivity and exposure intensity of the photoresist are adjusted, a method in which coating and patterning of the photoresist are repeated, or the like.

Next, the process in FIG. 3C will be described. In FIG. 3C, using the mask 301 formed in FIG. 3A, ion implantation of P-type impurity ions is performed in the region from the region where P-type ion implantation has been performed in FIG. 3B to the element isolation portion 205.

In the process illustrated in FIG. 3C, P-type impurity ions are first implanted with second ion implantation energy lower than the first ion implantation energy used in FIG. 3B. Specifically, the second ion implantation energy is ion implantation energy of approximately 2.0 MeV or more and 4.0 Me or less. The P-type impurity ion concentration to be implanted here is, for example, approximately $0.1 \times 10^{13}$ atoms/cm$^3$ or more and $3.0 \times 10^{13}$ atoms/cm$^3$ or less.

By this ion implantation, the P-type semiconductor region 224F is formed. The P-type semiconductor region 223 included in the P-type semiconductor region 224F is formed such that the impurity concentration peak is at a depth of 2 to 3 µm. The P-type semiconductor region 222 included in the P-type semiconductor region 224F is formed such that the impurity concentration peak is at a depth of 3 to 4 µm.

In the process illustrated in FIG. 3C, P-type ion implantation is performed a plurality of times. Starting with the second ion implantation energy, the ion implantation energy for an ion implantation is made smaller compared to that used in a previous ion plantation, every time the implantation is performed so that the plurality of P-type semiconductor regions 224 is formed from the deep part to the shallow part. It is to be noted that when the ion implantation energy is made smaller, the impurity ion concentration to be ion-implanted is reduced. Thus, it is possible to make the potential structure that allows the electric charges to easily move from the deep position of the semiconductor substrate to the N-type semiconductor region 201 as described above.

In FIG. 3D, N-type impurity ions are ion implanted into the shallow part of the semiconductor substrate 200 using the mask 301 to form the N-type semiconductor region 201. Note that when the N-type semiconductor region 201 is formed, the mask 301 may be removed and a mask having a thickness suitable for ion implantation energy used to form the N-type semiconductor region 201 may be formed.

After obtaining the state illustrated in FIG. 3D, the mask 301 is removed. Then, a gate electrode of a transistor (not illustrated) including the gate electrode 103 in FIG. 1, the P-type semiconductor region 206 in FIG. 2A, the N-type semiconductor region 214 in FIG. 1, and a source and a drain (not illustrated) of the transistor that is not illustrated may be formed.

According to the manufacturing method illustrated in FIGS. 3A to 3D, impurity ions are implanted with different ion implantation energies using the same mask to form a potential barrier down to the deep position of the semiconductor substrate 200 under the element isolation portion 205. Therefore, an imaging apparatus in which mixing of electric charges generated at the deep position of the semiconductor substrate in a pixel for providing the sensitivity to light on the long wavelength side, such as infrared light, into the photoelectric conversion portion and the like of an adjacent pixel is suppressed can be formed.

In addition, in FIG. 3C, the same mask 301 as that in FIG. 3B is used, but a mask different from the mask 301 may be used. In such a case, the distance from the bottom surface of the aperture of the mask 301 to the front surface of the semiconductor substrate 200 is made smaller than the distance from the bottom surface of the aperture of the different mask to the front surface of the semiconductor substrate 200. The second ion implantation energy is made to be the same ion implantation energy as the first ion implantation energy. Even in such a structure, it is possible to make the depth at which the P-type semiconductor region 224 is formed by the second ion implantation shallower than that in the first ion implantation. It is also possible to form an imaging device that suppresses mixing of electric charges into the photoelectric conversion portion and the like of an adjacent pixel.

Figure 4:
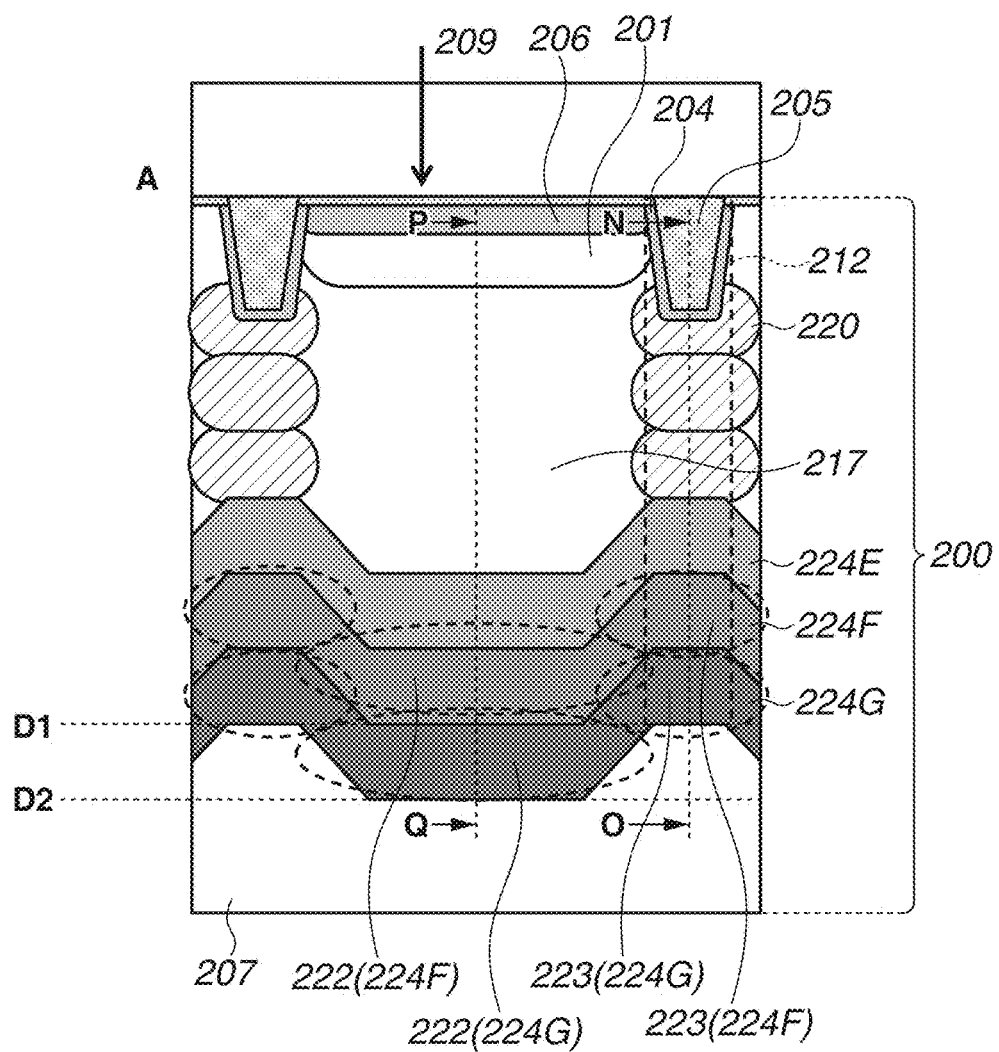
FIG. 4 is a schematic sectional view of an imaging device, according to one or more embodiment(s) of the present disclosure.

Using FIG. 4, FIGS. 5A to 5C, and FIGS. 13A and 13B, an imaging device according to a second exemplary embodiment applicable to the present disclosure will be described. FIG. 4 is a schematic sectional view of the imaging device according to the present exemplary embodiment, and is a schematic sectional view illustrating a cross section along the line segment AB in FIG. 1. In FIG. 4, the same reference numerals are given to components similar to those in FIGS. 1A to 3D, and the description of a similar structure to that according to the first exemplary embodiment will not be provided.

As illustrated in FIG. 4, an isolation region 212 according to the present exemplary embodiment includes an element isolation portion 205, a P-type semiconductor region 204, a plurality of P-type semiconductor regions 220, and a plurality of P-type semiconductor regions 223. The element isolation portion 205, the P-type semiconductor region 204, the plurality of P-type semiconductor regions 220, and the plurality of P-type semiconductor regions 223 are disposed in this order from the shallow part to the deep part of the semiconductor substrate 200.

Figure 13A:
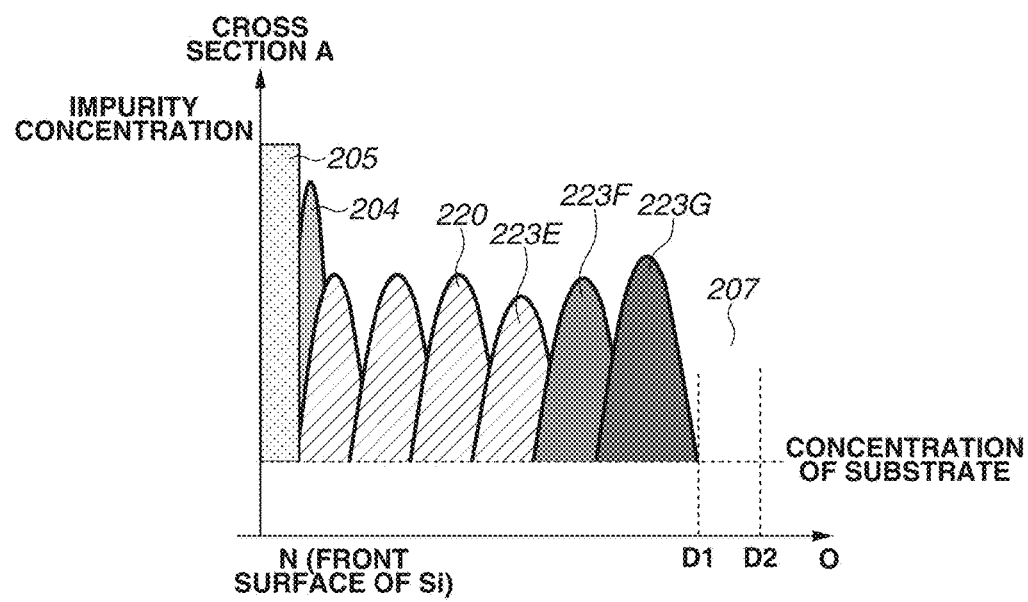
FIGS. 13A and 13B are diagrams illustrating impurity concentration, according to one or more embodiment(s) of the present disclosure.
Figure 13B:
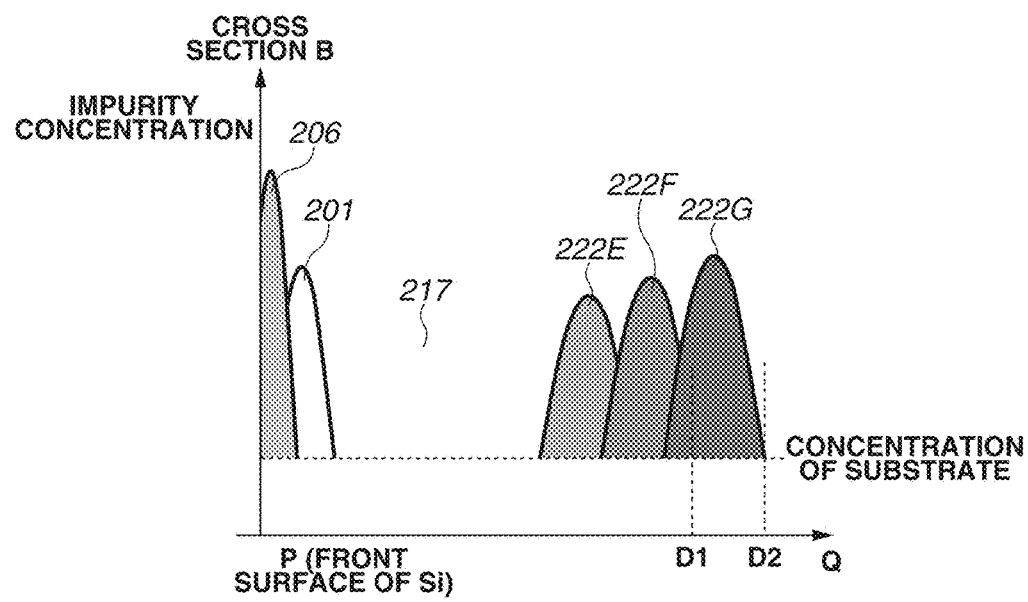

FIGS. 13A and 13B respectively illustrate the impurity concentration along the line segment NO and the line segment PQ of FIG. 4. As illustrated in FIG. 13A, the plurality of P-type semiconductor regions 223 are disposed continuously, and the impurity concentration peak of one of the P-type semiconductor regions 223 disposed at the deepest position is at a depth of 3 to 4 μm. In addition, the impurity concentration peak of one of the P-type semiconductor regions 223 formed at the shallowest position is at a depth of 1 to 2 μm. Between the P-type semiconductor region 223 disposed at the shallowest position and the element isolation portion 205, a P-type semiconductor region 220 is disposed to be continuous with the P-type semiconductor region 223 and the P-type semiconductor region 224.

In addition, as illustrated in FIG. 13B, the impurity concentration peak of one of the P-type semiconductor regions 222 disposed at the deepest position is at a depth of 4 to 5 μm. In addition, the impurity concentration peak of one of the P-type semiconductor regions 222 formed at the shallowest position is at a depth of 2 to 3 μm.

Between the P-type semiconductor region 222 formed at the shallowest position and an N-type semiconductor region 201, an N-type semiconductor region 217 is disposed. The N-type semiconductor region 217 and the N-type semiconductor region 201 are continuous regions. The N-type semiconductor region 217 includes, for example, the N-type semiconductor region 207.

Figure 5A:
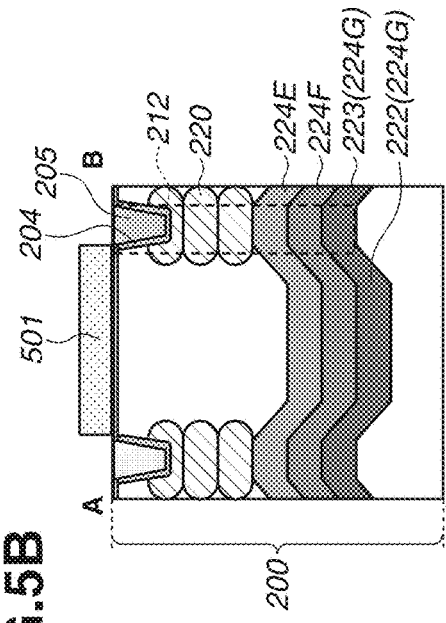
FIGS. 5A, 5B, and 5C are diagrams illustrating a manufacturing method of the imaging device, according to one or more embodiment(s) of the present disclosure.
Figure 5C:
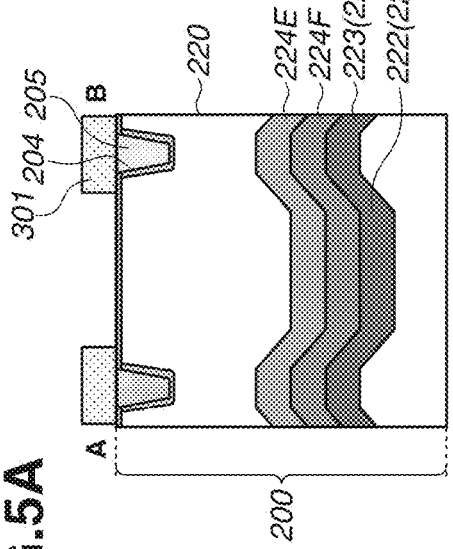
Figure 5B:
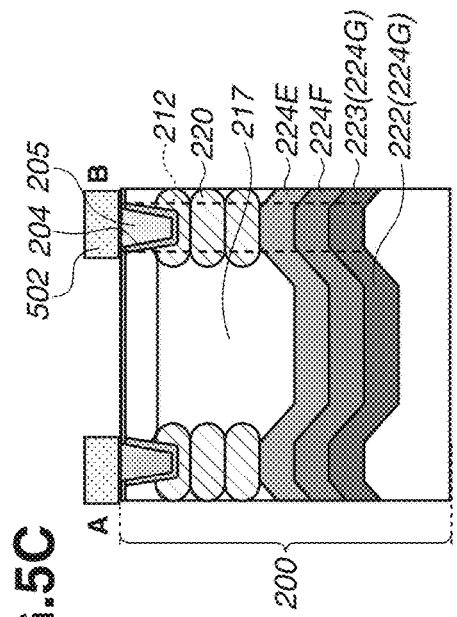

FIGS. 5A to 5C illustrate a manufacturing method of the imaging device according to the present exemplary embodiment. Here, the difference from the manufacturing method of the imaging device according to the first exemplary embodiment illustrated in FIGS. 3A to 3D will be described. The manufacturing method according to the present exemplary embodiment is similar to that according to the first exemplary embodiment up to the process illustrated in FIG. 3B. As illustrated in FIG. 5A, P-type ion implantation is performed a plurality of times using a mask 301 similar to the mask used in FIG. 3B. At this time, ion implantation is performed by gradually reducing the ion implantation energy. Specifically, for example, when implantation is performed three times, ion implantation is performed with a first ion implantation energy and ion implantation is performed with a second implantation energy lower than the first ion implantation energy. Then, ion implantation is performed with a third ion implantation energy lower than the second ion implantation energy.

When the P-type semiconductor region 224 including the P-type semiconductor region 223 having the impurity concentration peak at a depth of 1 to 2 μm is disposed by ion implantation, P-type ion implantation performed the plurality of times ends.

Then, the mask 301 is removed as illustrated in FIG. 5B, a mask 501 that covers a region to be the N-type semiconductor region 201 and has an aperture above the element isolation portion 205 is disposed. Using the mask 501, P-type ion implantation is performed a plurality of times from the region into which P-type ion implantation has been performed in FIG. 5A to the element isolation portion 205, whereby a plurality of P-type semiconductor regions 220 is formed.

At this time, ion implantation is performed by gradually reducing the ion implantation energy. When the ion implantation energy is gradually reduced to dispose the P-type semiconductor regions 220, it is not necessary to gradually reduce the impurity ion concentration. For example, the plurality of P-type semiconductor regions 220 may have the same impurity concentration.

In the process of FIG. 5B, the thickness of the mask 501 is made thicker than that of the mask 301. By forming the above-described mask 501, P-type implantation is not performed an the portion under the region to be the N-type semiconductor region 201. Accordingly, a region to be an N-type semiconductor region 217 that is continuous with the N-type semiconductor region 201 is left under the region to be an N-type semiconductor region 201.

Then, the mask 501 is removed as illustrated in FIG. 5C, and a mask 502 having an aperture above the region to be the N-type semiconductor region 201 and covers the upper part of the element isolation portion 205 is disposed. Using the mask 502, N-type ion implantation is performed into the shallow part of the semiconductor substrate 200 to form the N-type semiconductor region 201. At this time, the N-type semiconductor region remaining under the N-type semiconductor region 201 serves as the N-type semiconductor region 217.

In FIG. 5B, the P-type semiconductor region 220 is disposed at a depth at which the P-type semiconductor region 220 becomes continuous with the P-type semiconductor region 223 having the impurity concentration peak at a depth of 1 to 2 μm. In other words, compared to the ion implantation energy required in the case where the P-type semiconductor region 220 is disposed at a depth at which the P-type semiconductor region 220 becomes continuous with the P-type semiconductor region 223 having the impurity concentration peak at a depth of 4 to 5 µm, as illustrated in the comparative exemplary embodiment of FIG. 2B, the ion implantation energy in FIG. 5B is smaller. Therefore, the mask 501 formed to dispose the P-type semiconductor region 220 can have a thickness of approximately 1 to 2 µm. Therefore, the aspect ratio of the aperture of the mask 501 may be ¼ or less, which is advantageous in miniaturizing the pixel.

Similar effect to the first exemplary embodiment can be provided with the structure of the present exemplary embodiment also.

Figure 7:
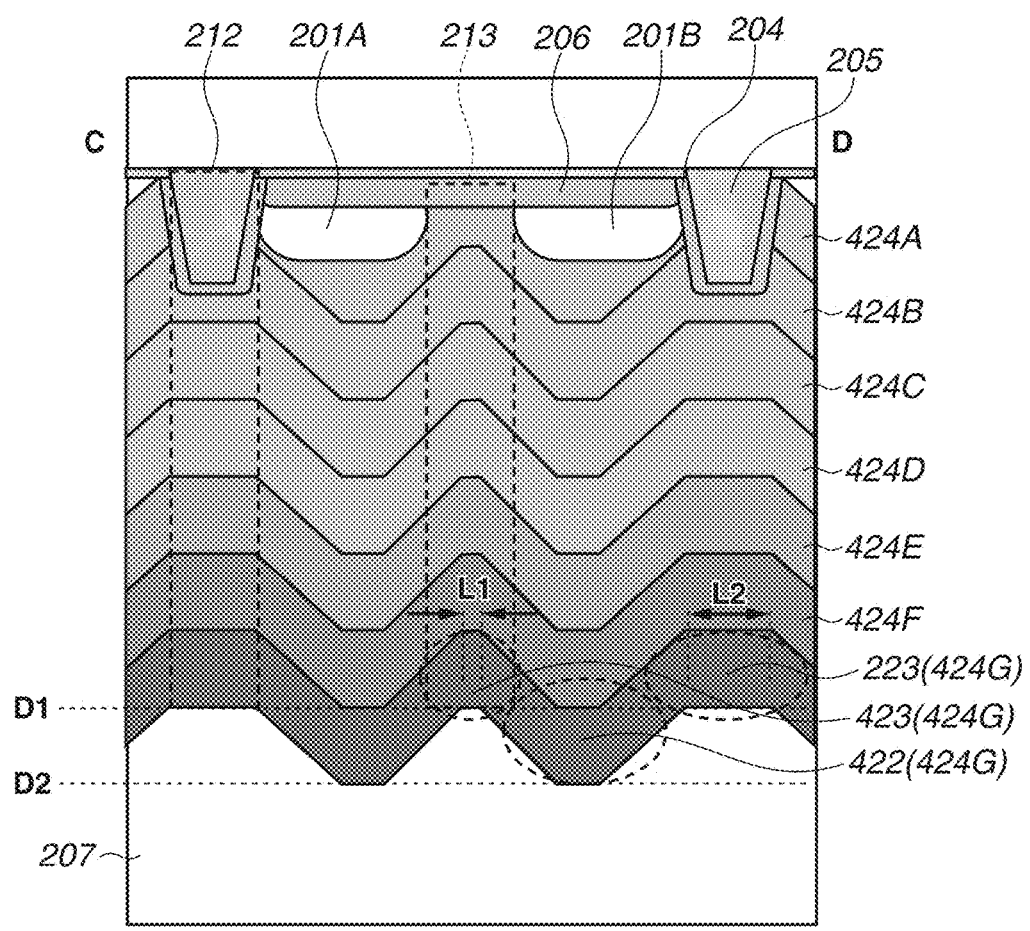
FIG. 7 is a schematic sectional view of the imaging device, according to one or more embodiment(s) of the present disclosure.

An imaging device according to a third exemplary embodiment will be described with reference to FIGS. 6A to 8D. FIGS. 6A and 6B are schematic plan views of the imaging device according to the present exemplary embodiment. FIG. 7 is a schematic sectional view schematically illustrating a cross section along the line segment CD in FIG. 6A. FIGS. 8A to 8D illustrate a manufacturing method of the imaging device according to the present exemplary embodiment. The same reference numerals are given to components similar to those in FIGS. 1A to 5C, and description thereof is not provided. FIG. 6A corresponds to FIG. 1A and FIG. 6B corresponds to FIG. 1B. In the following, only FIG. 6A will be described.

In FIG. 6A, one pixel 110 includes a photoelectric conversion portion 101A and a photoelectric conversion portion 101B, and a transfer transistor 102A and a transfer transistor 102B that transfer electric charges of the photoelectric conversion portion 101A and the photoelectric conversion portion 101B. In addition, one pixel 110 has a floating diffusion region 104A and a floating diffusion region 104B that hold electric charges transferred from the photoelectric conversion portions 101A and 101B. However, it is unnecessary to limit to a structure in which two of each type of the elements are provided in each pixel as long as a plurality of elements of each type is disposed. In addition, the floating diffusion region 104 may be shared by a plurality of photoelectric conversion portions 101.

In FIG. 6A, an N-type semiconductor region 201A and an N-type semiconductor region 201B included in electric charge accumulation regions of the two photoelectric conversion portions 101A and 101B, respectively, are isolated by an isolation region 213.

Specifically, as illustrated in FIG. 7, a P-type semiconductor region 423 is disposed between the N-type semiconductor region 201A and the N-type semiconductor region 201B respectively included in the two photoelectric conversion portions 101A and 101B. A P-type semiconductor region 422 is a region corresponding to the P-type semiconductor region 222 of FIG. 2A.

A width L1 of the P-type semiconductor region 423 included in the isolation region 213 may be narrower in a plan view than a width L2 of the P-type semiconductor region 223 included in the isolation region 212 such that the width L1 is approximately 0.4 to 1.0 times the width L2. This can ensure the areas of the N-type semiconductor region 201A and the N-type semiconductor region 201B and increase saturation of each photoelectric conversion portion 101.

In the present exemplary embodiment, the P-type semiconductor region 423, the P-type semiconductor region 223, and the P-type semiconductor region 422 are continuous and are collectively referred to as a P-type semiconductor regions 424 for convenience.

By making the widths of the two regions different, the potential barrier of the isolation region 213 can be made lower than the potential barrier of the isolation region 212.

FIGS. 8A to 8D illustrate the manufacturing method of the imaging device according to the present exemplary embodiment. Here, the difference from the manufacturing method of the imaging device according to the first exemplary embodiment illustrated in FIGS. 3A to 3D will be described. In FIGS. 3A to 3D, the mask 301 having an aperture in at least a part of the region to be the N-type semiconductor region 201 and covers the upper part of an element isolation portion 205 is disposed. However, in FIGS. 8A to 8D, a mask 801 having apertures in at least parts of regions to be an N-type semiconductor region 201A and a region to be an N-type semiconductor region 201B and covers upper parts of the element isolation portion and a region between the N-type semiconductor region 201A and the N-type semiconductor region 201B is disposed.

As described above, the width L1 of the P-type semiconductor region 423 is narrower than the width L2 of the P-type semiconductor region 223. Therefore, the width of the mask 801 between the N-type semiconductor region 201A and the N-type semiconductor region 201B is narrower than the width of the mask 801 of the element isolation portion.

Figure 8A:
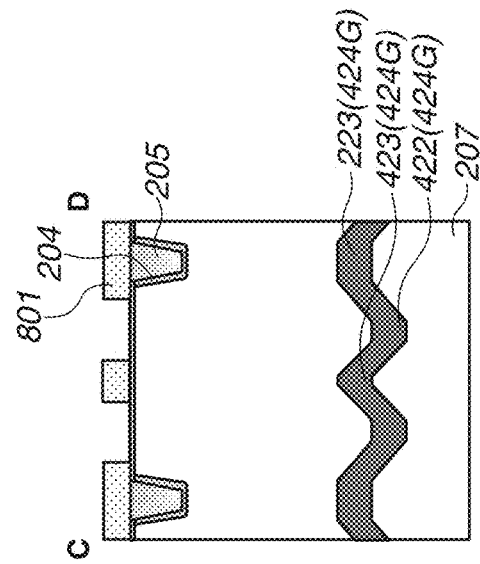
FIGS. 8A, 8B, 8C, and 8D are diagrams illustrating a manufacturing method of the imaging device, according to one or more embodiment(s) of the present disclosure.
Figure 8B:
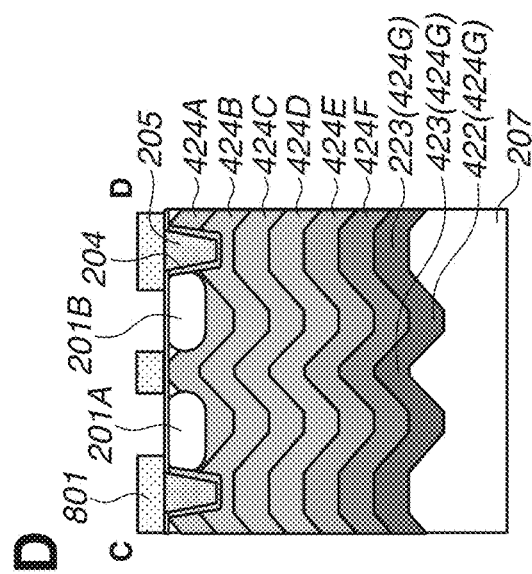
Figure 8C:
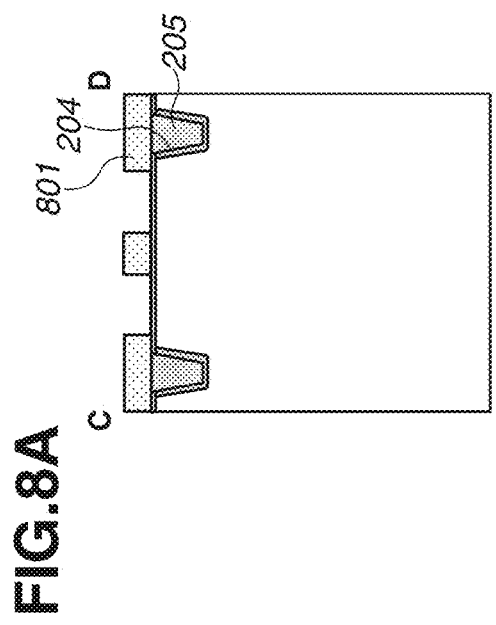
Figure 8D:
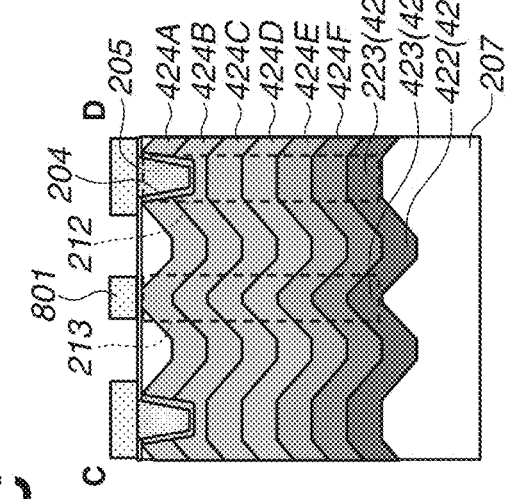

By performing P-type ion implantation using the mask 801, it is possible to dispose the P-type semiconductor region 423 between the N-type semiconductor region 201A and the N-type semiconductor region 201B as illustrated in FIGS. 8B to 8D.

When electric charges overflow in a photoelectric conversion portion, mixing of electric charges into the photoelectric conversion portion of adjacent pixels may occur. The structure according to the present exemplary embodiment can reduce such mixing. The present exemplary embodiment is applicable to all exemplary embodiments.

An imaging device according to a fourth exemplary embodiment applicable to the present disclosure will be described with reference to FIGS. 9 and 10. FIG. 9 is a schematic plan view of the imaging device. FIG. 10 is a schematic sectional view schematically illustrating a cross section along the line segment EF of FIG. 9. The same reference numerals are given to components similar to those in FIGS. 1A to 5C, and description thereof is not provided.

The imaging device according to the present exemplary embodiment has a pixel in which a visible light filter corresponding to at least one color is disposed in addition to a pixel 110 in which an infrared light filter corresponding to infrared light (IR) is disposed. FIG. 9 illustrates, as an example, a structure including the pixel 110 in which the infrared light filter is disposed and pixels 110 in which different types of visible light filters of red (R), blue (B), and green (G) are disposed.

Next, FIG. 10 will be described. In FIG. 10, a microlens 707 for condensing light incident on each pixel 110 around the center of a corresponding photoelectric conversion portion 101 is disposed on the upper part of the pixel 110. In a pixel 110A, a visible light filter 703 corresponding to green is disposed under the microlens 707. In a pixel 110B, a visible light filter 702 corresponding to blue is disposed under the microlens 707. In a pixel 110C, an infrared light filter 704 is disposed under the microlens 707.

Wiring layers 705 are formed under the visible light filter 702, the visible light filter 703, and the infrared light filter 704. An interlayer film 706 that transmits light incident through the microlenses 707 is disposed between the lines.

In the present exemplary embodiment, an example of a front-side irradiation sensor is illustrated. However, the structure according to the present exemplary embodiment may be applied to back-side irradiation sensors. In that case, the wiring layers 705 are disposed on the side opposite to the incident surface.

In FIG. 10, P-type semiconductor regions 222 and P-type semiconductor regions 223 of FIG. 2A are disposed at different depths from each other. More specifically, positions of interfaces between the P-type semiconductor regions 222 and an N-type semiconductor region 207, and interfaces between the P-type semiconductor regions 223 and the N-type semiconductor region 207 are changed according to the length of the wavelength of light incident on the photoelectric conversion portion 101 upon transmission through the visible light filter and the infrared light filter.

In the present exemplary embodiment, the pixel 110C has a similar structure to the pixel 110 in FIG. 2A. In the pixel 110A, a P-type semiconductor region 711 is a region corresponding to the P-type semiconductor region 222 of the pixel 110C. A P-type semiconductor region 712 is a region corresponding to the P-type semiconductor region 223 of the pixel 110C. In the pixel 110B, the P-type semiconductor region 712 disposed under an element isolation portion 205 and a P-type semiconductor region 714 disposed under the photoelectric conversion portion 101 are disposed at the same depth.

The P-type semiconductor region 711, the P-type semiconductor region 712, the P-type semiconductor region 714, the P-type semiconductor region 222, and the P-type semiconductor region 223 are continuous regions and are referred to as a P-type semiconductor region 724 for convenience.

The P-type semiconductor region 712 and a P-type semiconductor region 220 are disposed under the element isolation portion 205 and are included in an isolation region 212A. The P-type semiconductor region 223 and a P-type semiconductor region 220 are disposed under the element isolation portion 205 and included in an isolation region 212B.

In FIG. 10, the P-type semiconductor region 712 and the P-type semiconductor region 223 form a PN junction with the N-type semiconductor region 207, and the depth of the PN junction interface is at a depth D2. In this exemplary embodiment, the P-type semiconductor region 223, the P-type semiconductor region 712, and the P-type semiconductor region 714 are disposed at the same depth, but they can be disposed at different depths as long as they are continuous.

The P-type semiconductor region 711 forms a PN junction with the N-type semiconductor region 207, and the depth of the PN junction interface is at a depth D3 that is a position deeper than the depth D2. The P-type semiconductor region 222 forms a PN junction with the N-type semiconductor region 207, and the depth of the PN junction interface is at a depth D1 that is a position deeper than the depth D3. That is, the depth at which the P-type semiconductor regions disposed under the photoelectric conversion portions 101 are disposed are changed corresponding to the wavelengths of the light incident on the photoelectric conversion portions 101.

According to such a structure, the photoelectric conversion portion 101 of the pixel 110C having the infrared light filter 704 can accumulate electric charges generated down to the deepest position D1, which is the deepest position, in the electric charge accumulation region of the photoelectric conversion portion 101. The photoelectric conversion portion 101 of the pixel 110A having the green visible light filter 703 can accumulate electric charges generated down to the depth D3, which is a position shallower than the depth D1, in the electric charge accumulation region of the photoelectric conversion portion 101. The photoelectric conversion portion 101 of the pixel 110B having the blue visible light filter 702 can accumulate electric charges generated at the depth D2, which is a position shallower than the depth D3, in the electric charge accumulation region of the photoelectric conversion portion 101.

According to such a structure, a photoelectric conversion portion of each pixel can have a structure having high photoelectric conversion efficiency for a wavelength of light incident on the photoelectric conversion portion.

A manufacturing method the imaging device according to the present exemplary embodiment will be described with reference to FIG. 11. Here, only the mask which is different from that in FIG. 3A will be described.

A mask 901 in FIG. 11 corresponds to the mask 301 in FIG. 3A. The mask 901 in FIG. 11 is different from the mask 301 in that the mask 901 covers a region to be the N-type semiconductor region 201 of the pixel 110B having the blue visible light filter 702.

In FIG. 11, a mask 902 having a thickness W2, which is smaller than the thickness W1 of the mask 901, is disposed to cover a region to be the N-type semiconductor region 201 of the pixel 110A having the green visible light filter 703. By disposing the mask 902, the depth at which the P-type semiconductor region 711 is disposed is made shallower than the depth at which the P-type semiconductor region 222 is disposed. According to such a structure, it is possible to form the imaging device having the structure of FIG. 10 by ion implantation as illustrated in FIGS. 5B and 5C. Although not illustrated, for a pixel having a red visible light filter, a mask having a thickness smaller than the thickness W2 of the mask 902 is disposed, and ion implantation as illustrated in FIGS. 5B and 5C is performed. Alternatively, implantation similar to that in FIGS. 3B and 3C may be performed.

According to such a structure, the photoelectric conversion portion. 101 of each pixel 110 can have a structure with high photoelectric conversion efficiency for a wavelength of light incident on the photoelectric conversion portion 101. Therefore, according to the structure according to the present exemplary embodiment, the sensitivity of the photoelectric conversion portion can be improved in addition to obtaining the effect of the first exemplary embodiment.

The depth of each pixel in FIG. 10 can be determined based on the wavelength of the incident light and the absorption coefficient of the substrate that performs photoelectric conversion. For example, the depth D1 can be set to a depth of approximately 5 μm to several tens μm based on the wavelength of infrared light.

Here, the structure in which the photoelectric conversion efficiency is high for the wavelengths of the light incident on the photoelectric conversion portions of all pixels is illustrated, but it is only required that photoelectric conversion efficiency for at least one color pixel is high. For example, only a pixel having an infrared light filter has the structure according to the present exemplary embodiment, and the PN junction interfaces between the N-type semiconductor regions 207 and the P-type semiconductor regions disposed under the photoelectric conversion portions 101 of the pixels having the other visible light filters may be at the depth D2.

In this case, the mask 901 also covers the region to be the N-type semiconductor region 201 of the pixel 110A, and the mask 902 is not disposed.

The present exemplary embodiment is applicable to all exemplary embodiments.

(Application to Imaging System)

In the present exemplary embodiment, a case where the imaging devices described in the first exemplary embodiment to the fifth exemplary embodiment are applied to an imaging system will be described with reference to FIG. 14. The imaging system is a digital still camera, a digital video camera or a digital camera for a mobile phone.

Figure 14:
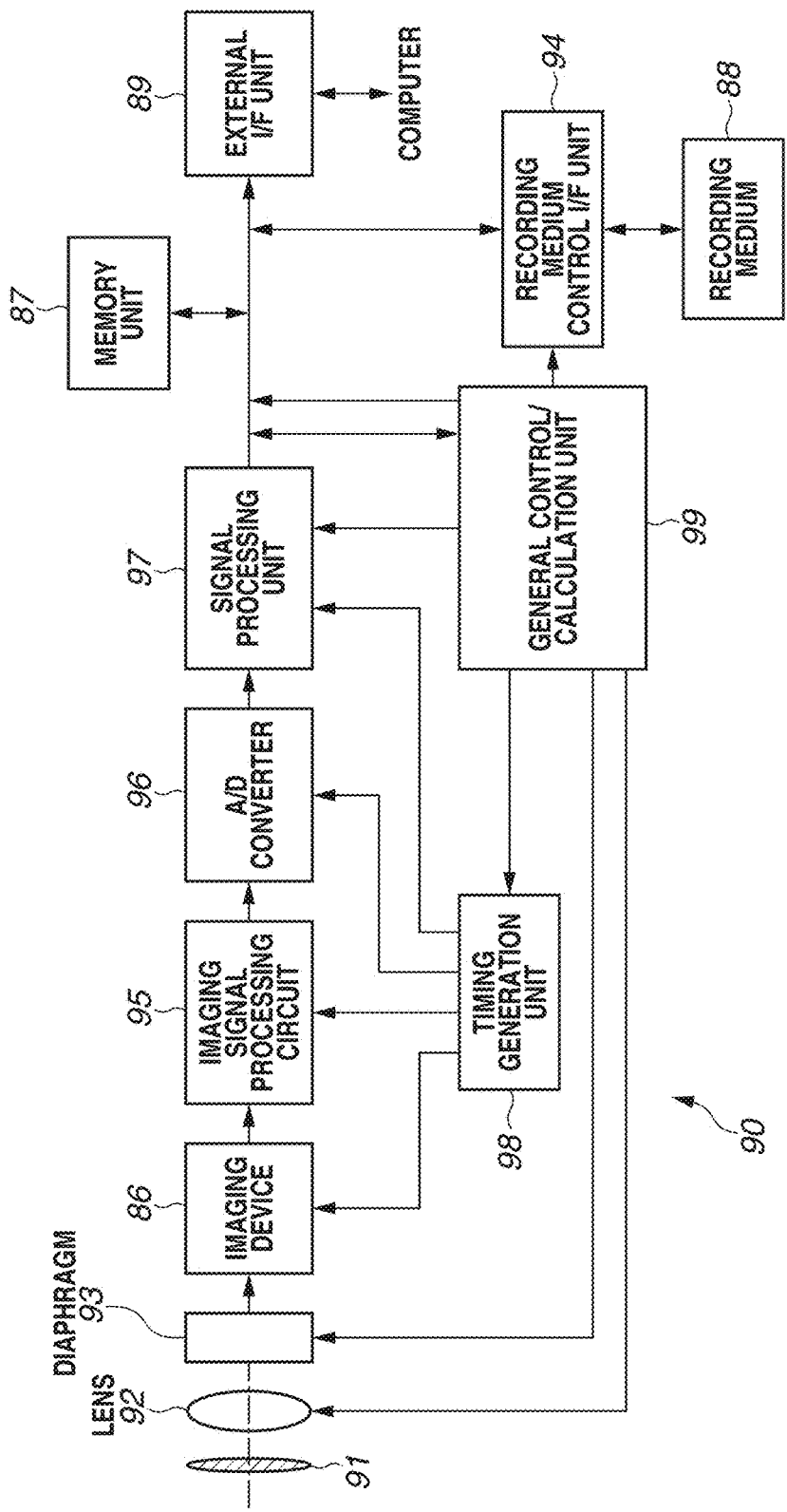
FIG. 14 is a block diagram illustrating an imaging system, according to one or more embodiment(s) of the present disclosure.

FIG. 14 illustrates a structure of a digital still camera 90. An optical image of an object is formed on an imaging surface of an imaging device 86 by the optical system including a lens 92 and the like. The imaging device 86 is the imaging device described in the first to fifth exemplary embodiments.

A barrier 91 serving as both a protection function and a main switch of the lens 92 may be provided outside the lens 92. The lens 92 may be provided with a diaphragm 93 for adjusting the amount of light emitted from the lens 92. On an imaging signal output from the imaging device 86, processes such as various ways of correction and clamping are performed by an imaging signal processing circuit 95. The imaging signal output from the imaging signal processing circuit 95 is subjected to analog-to-digital conversion by aa A/D converter 96. Various corrections, data compression, and the like are performed an the image data output from the A/D converter 96 by a signal processing unit (image processing unit) 97.

The imaging device 86, the imaging signal processing circuit 95, the A/D converter 96, and the signal processing unit 97 operate in accordance with timing signals generated by a timing generation unit 98. Each block is controlled by a general control/calculation unit 99.

The digital still camera 90 also includes a memory unit 87 that temporarily stores image data, and a recording medium control interface unit 94 for recording an image on or reading an image from a recording medium 88. The recording medium 88 includes a semiconductor memory and the like, and is attachable and detachable. The digital still camera 90 may also include an external interface unit (I/F) 89 for communicating with an external computer or the like. Here, the components 95, 96, 97, namely, the imaging signal processing circuit 95, the A/D converter 96, and the signal processing unit 97 may be formed on the same chip as the imaging device 86.

Next, the operation of FIG. 14 will be described. In response to opening of the barrier 91, a main power source, a power source of the control system, and a power source of the imaging system circuit including the A/D converter 96 are sequentially turned on. Thereafter, in order to control the exposure amount, the general control/calculation unit 99 opens the diaphragm 93. A signal output from the imaging device 86 passes through the imaging signal processing circuit 95 and is provided to the A/D converter 96. The A/D converter 96 Performs A/D conversion on the signal and outputs the signal after the conversion to the signal processing unit 97. The signal processing unit 97 processes the data and provides the data to the general control/calculation unit 99, and the general control/calculation unit 99 calculates to determine the exposure amount. The general control/calculation unit 99 controls the diaphragm based on the determined exposure amount.

Next, the general control/calculation unit 99 extracts a high frequency component from the signal having been output from the imaging device 86 and processed by the signal processing unit 97, and calculates the distance to the object based on the high frequency component. Thereafter, the general control/calculation unit 99 determines whether focusing is achieved by driving the lens 92. If it is determined that focusing is not achieved, the general control/calculation unit 99 calculates the distance by driving the lens 92 again.

After the focusing is confirmed, main exposure starts. Upon completion of the exposure, the imaging signal having been output from the imaging device 86 is subjected to correction and other process by the imaging signal processing circuit 95, subjected to A/D conversion by the A/D converter 96, and processed by the signal processing unit 97. The image data having been processed by the signal processing unit 97 is accumulated in the memory unit 87 by the general control/calculation unit 99. Thereafter, the image data having been accumulated in the memory unit 87 is recorded on the recording medium 88 via the recording medium control I/F unit 94 under the control of the general control/calculation unit 99.

In addition, the image data is provided to a computer or the like through the external interface unit 89 to be processed thereby. In this manner, the imaging device of the present disclosure is applied to an imaging system.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-254363, filed Dec. 27, 2016, which is hereby incorporated by reference in its entirety.

What is claimed is:

1. A manufacturing method of an imaging device including, in a semiconductor substrate:
a plurality of pixels each including:
a first active region in which an electric charge accumulation region of a first conductivity type configured to accumulate signal electric charges is disposed; and
an element isolation portion that isolates the first active region from a second active region adjacent to the first active region, the method comprising:
ion-implanting impurity ions of a second conductivity type different from the first conductivity type into a first region and a second region using a first mask, the first region being disposed under a region to be the electric charge accumulation region and the second region being under the element isolation portion, continuous with the first region, and positioned shallower than the first region; and
ion-implanting impurity ions of the second conductivity type into a third region and a fourth region. using a second mask, the third region being disposed under the region to be the electric charge accumulation region and positioned shallower than the first region, and the fourth region being under the element isolation portion, continuous with the third region and the second region, and positioned shallower than the third region and the second region,
wherein the first mask covers an upper part of the element isolation portion and has an aperture corresponding to at least a part of the region to be the electric charge accumulation region, and wherein the second mask covers the upper part of the element isolation portion and has an aperture corresponding to at least a part of the region to be the electric charge accumulation region.

2. The manufacturing method according to claim 1, wherein the first mask and the second mask are the same mask.

3. The manufacturing method according to claim 1, wherein the aperture of the first mask does not cover a front surface of the semiconductor substrate or the aperture of the second mask does not cover the front surface of the semiconductor substrate.

4. The manufacturing method according to claim 2, wherein a distance from a bottom surface of the aperture of the first mask to a front surface of the semiconductor substrate is smaller than a distance from an upper part of the first mask disposed on the element isolation portion to the front surface of the semiconductor substrate.

5. The manufacturing method according to claim 2, wherein a first ion implantation energy in the ion-implanting using the first mask is larger than a second ion implantation energy in the ion-implanting using the second mask.

6. The manufacturing method according to claim 5, wherein in the ion-implanting using the second mask, ion implantation of impurity ions of the second conductivity type is performed with the second ion implantation energy, and then ion implantation of impurity ions of the second conductivity type is performed with a third ion implantation energy lower than the second ion implantation energy.

7. The manufacturing method according to claim wherein a distance from a bottom surface of the hole of the first mask to a front surface of the semiconductor substrate is smaller than a distance from a bottom surface of the aperture of the second mask to the front surface of the semiconductor substrate.

8. The manufacturing method according to claim. 7 wherein the first ion implantation energy is equal to the second implantation energy.

9. The manufacturing method according to claim 1, wherein the third region and the first region are continuous.

10. The manufacturing method according to claim 1, wherein a thickness of the first mask is 1 μm or more and 2 μm or less.

11. The manufacturing method according to claim 1 further comprising ion-implanting impurity ions of the second conductivity type into a region from a shallowest region of the regions, into which the impurity ions have been implanted using the second mask, to a depth at which the element isolation portion is disposed using a third mask after removing the second mask and then forming, on the semiconductor substrate, the third mask having an aperture corresponding to the upper part of the element isolation portion and covers the region to be the electric charge accumulation region.

12. The manufacturing method according to claim 1, wherein a concentration of the impurity ion of the second conductivity type in the ion-implanting using the second mask is lower than a concentration of the impurity ion of the second conductivity type in the ion-implanting using the first mask.

13. The manufacturing method according to claim 1, wherein the pixels each include a plurality of the electric charge accumulation regions, and the first mask covers a space between the plurality of electric charge accumulation regions in the ion-planting using the first mask.

14. The manufacturing method according to claim 13, wherein, in a plan view, a width of the first mask covering the space between the plurality of electric charge accumulation regions is smaller than a width of the first mask covering the element isolation portion.

15. The manufacturing method according to claim 1, wherein the plurality of pixels includes an infrared light filter.

16. The manufacturing method according to claim 1, wherein the plurality of pixels includes:
a pixel having an infrared light filter; and
a pixel having a visible light filter, and
wherein in the ion-implanting using the first mask, a fourth mask is formed to cover the region to be the electric charge accumulation region included in the pixel having the visible light filter after forming the first mask.

17. The manufacturing method according to claim 1, wherein the plurality of pixels includes a first pixel and a second pixel adjacent to the first pixel, and
wherein the second active region of the first pixel is the first active region of the second pixel.

18. The manufacturing method according to claim 1, wherein the plurality of pixels includes a first pixel and a second pixel adjacent to the first pixel, and
wherein, in the second active region of the first pixel, a pixel transistor including an amplifying portion that outputs a signal based on signal charges accumulated in the electric charge accumulation region of the first pixel is disposed.

19. The manufacturing method according to claim 1, wherein a peripheral circuit region is disposed around a pixel region in which the plurality of pixels are disposed, and
wherein a fifth mask that covers an upper part the peripheral circuit region and is thicker than the first mask is disposed before the ion-implanting using the first mask.

20. An imaging system comprising:
an imaging device manufactured by the manufacturing method according to claim 1; and
a signal processing circuit configured to process a signal from the imaging device.

* * * * *